(12) United States Patent
Lee et al.

(10) Patent No.: US 10,355,189 B2
(45) Date of Patent: Jul. 16, 2019

(54) THERMOELECTRIC GENERATION UNIT

(71) Applicant: KELK Ltd., Hiratsuka-shi, Kanagawa (JP)

(72) Inventors: Yonghoon Lee, Hiratsuka (JP); Kouji Nagano, Hiratsuka (JP); Hiroyuki Matsunami, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 15/537,632

(22) PCT Filed: Mar. 2, 2016

(86) PCT No.: PCT/JP2016/056369
§ 371 (c)(1),
(2) Date: Jun. 19, 2017

(87) PCT Pub. No.: WO2016/143620
PCT Pub. Date: Sep. 15, 2016

(65) Prior Publication Data
US 2017/0365761 A1 Dec. 21, 2017

(30) Foreign Application Priority Data
Mar. 6, 2015 (JP) .................................. 2015-045212

(51) Int. Cl.
*H01L 35/02* (2006.01)
*H01L 35/32* (2006.01)

(52) U.S. Cl.
CPC .............. *H01L 35/02* (2013.01); *H01L 35/32* (2013.01)

(58) Field of Classification Search
CPC ......... H01L 35/02; H01L 35/32; H01L 35/30; H01L 35/325; H01L 35/34
See application file for complete search history.

(56) References Cited

U.S. PATENT DOCUMENTS 6,028,263 A  2/2000  Kobayashi et al.
6,112,525 A * 9/2000  Yoshida .................. F25B 21/02
                                                                        62/3.2
(Continued)

FOREIGN PATENT DOCUMENTS

CN  1463048 A  12/2003
CN  1744338 A   3/2006
(Continued)

OTHER PUBLICATIONS

International Preliminary Report on Patentability in International Application No. PCT/2016/056369, dated Sep. 17, 2017, 7 pages (with English translation).
(Continued)

*Primary Examiner* — Devina Pillay
*Assistant Examiner* — Daniel P Malley, Jr.
(74) *Attorney, Agent, or Firm* — Fish & Richardson P.C.

(57) ABSTRACT

A thermoelectric generator unit includes: a case having a heating surface and a cooling surface; first to fourth thermoelectric generator modules housed in the case, the thermoelectric generator modules including a plurality of thermoelectric elements; a multilayer substrate including: a first layer including an interelement electrode for forming an output circuit configured to connect the thermoelectric elements; a second layer provided with a plurality of through holes penetrating therethrough from front to back; and a third layer including a plurality of bypass patterns electrically continuous with the through holes; and lead pins that penetrate through the case inward and outward, the lead pins having base ends connected to both ends of the output circuit on a surface of the first layer, the output circuit being defined in each of the thermoelectric generator modules.

10 Claims, 12 Drawing Sheets

(56) References Cited

U.S. PATENT DOCUMENTS

| | | | | |
|---|---|---|---|---|
| 7,365,264 B2 * | 4/2008 | Moriyama | ............... | H01L 35/32 136/200 |
| 7,436,059 B1 * | 10/2008 | Ouyang | ................... | H01L 23/34 257/712 |
| 9,144,180 B2 * | 9/2015 | Olsson | ..................... | H01L 35/32 |
| 2003/0214031 A1 | 11/2003 | Onoue | | |
| 2006/0042675 A1 | 3/2006 | Tateyama et al. | | |
| 2007/0227158 A1 | 10/2007 | Kuchimachi | | |
| 2008/0276624 A1 * | 11/2008 | Morimoto | ................ | F25B 21/02 62/3.7 |
| 2011/0030754 A1 * | 2/2011 | Smythe | ................... | H01L 35/08 136/233 |
| 2013/0200919 A1 * | 8/2013 | Fokkelman | ............. | G01R 31/26 324/762.01 |

FOREIGN PATENT DOCUMENTS

| | | |
|---|---|---|
| EP | 878851 A2 | 11/1998 |
| JP | H11-032492 | 2/1999 |
| JP | 2000-286468 | 10/2000 |
| JP | 2003-110155 | 4/2003 |
| JP | 2003-347604 | 12/2003 |
| JP | 2006-237547 | 9/2006 |
| JP | 2007-294864 | 11/2007 |
| JP | 2008-091442 | 4/2008 |
| JP | 2008-186974 | 8/2008 |
| JP | 2013-191801 | 9/2013 |
| TW | 200919790 | 5/2009 |

OTHER PUBLICATIONS

International Search Report and Written Opinion for corresponding International Application No. PCT/JP2016/056369, dated May 17, 2016, 11 pages with English translation.

Chinese Office Action in Chinese Application No. 201680007784.8, dated Dec. 12, 2018, 12 pages with English Translation.

Japanese Office Action in Japanese Application No. 2015-045212, dated Mar. 12, 2019, 6 pages with English Translation.

* cited by examiner

THERMOELECTRIC GENERATION UNIT

CROSS-REFERENCE TO RELATED APPLICATIONS

This application claims priority to International Application No. PCT/JP20016/05639 filed on Mar. 2, 2016, the contents of which are incorporated herein in their entirety.

TECHNICAL FIELD

The present invention relates to a thermoelectric generator unit.

BACKGROUND ART

A thermoelectric generator module generates an electric power from a difference in temperature between two objects through conversion of the difference in temperature to electric voltage (i.e., the Seebeck effect).

For instance, Patent Literature 1 describes a known thermoelectric generator unit including a typical thermoelectric generator module.

The thermoelectric generator unit of Patent Literature 1 includes a plurality of thermoelectric generator modules that are connected to a common terminal block through terminals to form a single series circuit. To diagnose the condition of each of the thermoelectric generator modules of the thermoelectric generator unit of Patent Literature 1, a terminal, which is detached from the terminal block, is touched with a tester to measure, for instance, the internal resistance of each of the thermoelectric generator modules.

Further, when any one of the thermoelectric generator modules of the thermoelectric generator unit of Patent Literature 1 declines in performance or stops in function, the malfunctioning thermoelectric generator module is short-circuited, and the attachment positions of the terminals with respect to the terminal block are changed so that the rest of the thermoelectric generator modules can generate an electric power.

CITATION LIST

Patent Literature(s)

Patent Literature 1: JP-A-2003-110155

SUMMARY OF THE INVENTION

Problem(s) to Be Solved by the Invention

Some thermoelectric generator units, however, include thermoelectric generator modules housed in a case hermetically closed by, for instance, welding, to prevent functional decline of thermoelectric elements and the thermoelectric generator modules. Since such a case cannot be opened/closed as needed, the terminal block cannot be housed in the case.

The terminal block may also be disposed outside the case with wiring from the thermoelectric generator modules being taken outside in order to diagnose the conditions of the thermoelectric generator modules or to short-circuit malfunctioning one of the thermoelectric generator modules. Such an arrangement, however, requires an increase in the wiring (cable wires) in the case, which decreases the filing of thermoelectric elements or the thermoelectric generator modules in the case. A heat loss in the case is thus increased, which results in a decrease in the output per unit area.

An object of the invention is to provide a thermoelectric generator unit configured to allow for a reliable diagnosis of a thermoelectric generator module without the necessity of opening/closing the case, to increase an output per unit area, and to keep on operating irrespective of the malfunction of the thermoelectric generator module.

Means for Solving the Problem(s)

According to an aspect of the invention, a thermoelectric generator unit includes: a case having a heating surface and a cooling surface; a plurality of thermoelectric generator modules housed in the case, the thermoelectric generator modules including a plurality of thermoelectric elements; a multilayer substrate including: a first layer including an interelement electrode for forming an output circuit configured to connect the thermoelectric elements; a second layer provided with a plurality of through holes penetrating threrethrough from front to back; and a third layer including a plurality of bypass patterns electrically continuous with the through holes; and lead pins that penetrate through the case inward and outward, the lead pins having base ends connected to both ends of the output circuit on a surface of the first layer, the output circuit being defined in each of the thermoelectric generator modules.

In the thermoelectric generator unit of the above aspect, the base ends of the lead pins, which penetrate through the case inward and outward, are connected to both ends of the output circuit defined in each of the thermoelectric generator modules. The thermoelectric generator modules are thus individually diagnosed without the necessity of opening/closing the case.

Further, one of the thermoelectric generator modules to be diagnosed can be changed simply by choosing the lead pin. As compared with an instance where a mechanism (e.g., terminal block) for changing an object to be diagnosed is provided in the case, the filing rate of the thermoelectric elements and the thermoelectric generator modules can be increased, and a device, which includes the thermoelectric generator unit with a high temperature, does not need to be stopped.

Further, the first layer is provided with the interelement electrode for forming the output circuit, and the second layer is provided with the through holes, which are electrically continuous with the plurality of bypass patterns of the third layer. As a result, the plurality of thermoelectric generator modules, which are electrically continuous through the bypass patterns, can be diagnosed. Further, such an electrical continuity requires no cable wire, and thus does not decrease the filing rate.

In the above aspect, it is preferable that the thermoelectric generator unit is configured to detect an output from each of the thermoelectric generator modules and an output from a selective combination of two or more of the thermoelectric generator modules.

In the above aspect, it is preferable that the multilayer substrate is provided between the cooling surface and the thermoelectric generator modules.

In the above aspect, it is preferable that the thermoelectric generator unit further includes a heat insulating member provided in the case between the heating surface and the lead pins.

BRIEF DESCRIPTION OF DRAWING(S)

DESCRIPTION OF EMBODIMENT(S)

An exemplary embodiment of the invention will be described below with reference to FIGS. 1 to 9.

Figure 1:
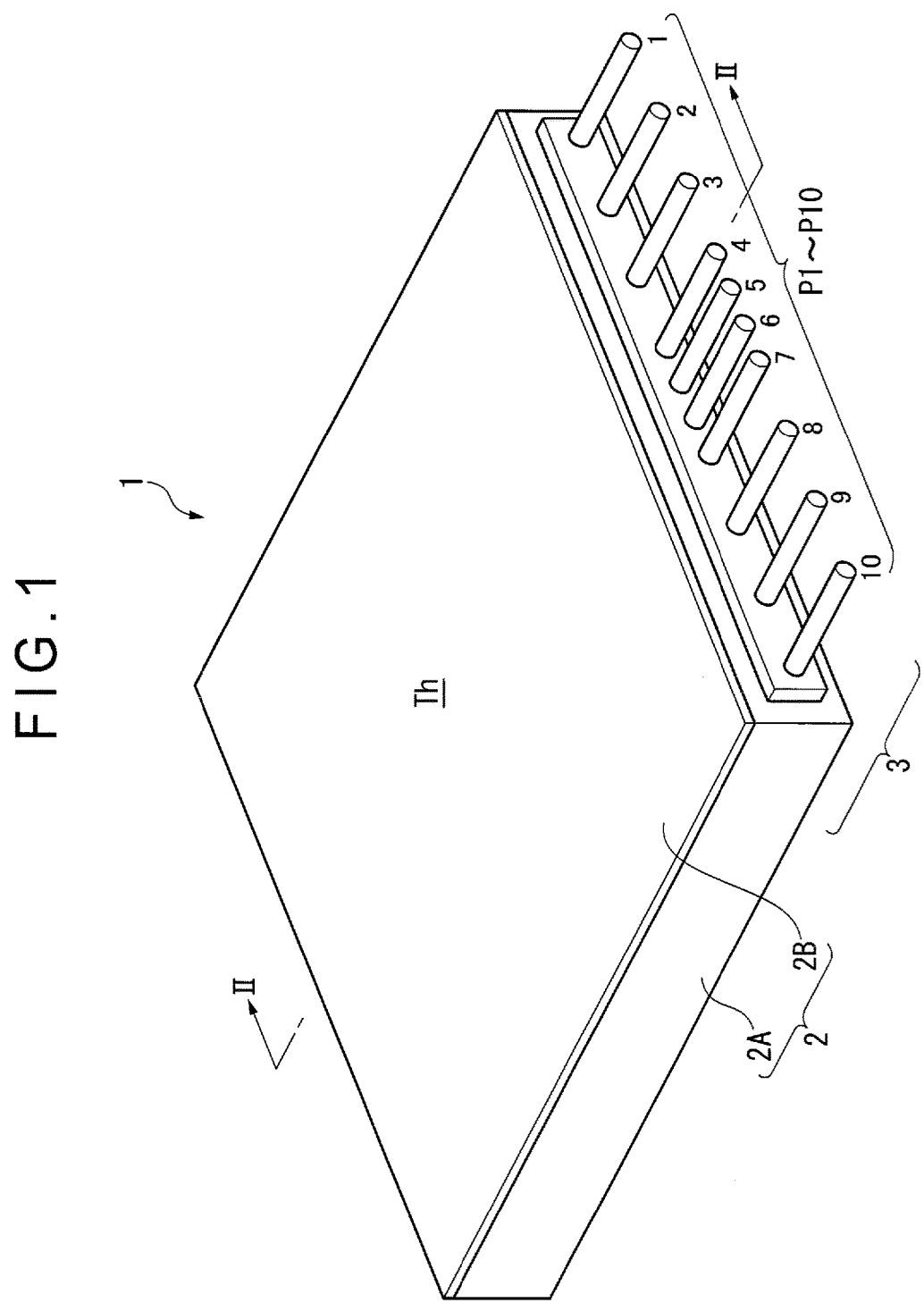
FIG. 1 is a perspective view of a thermoelectric generator unit according to an exemplary embodiment of the invention.
Figure 2:
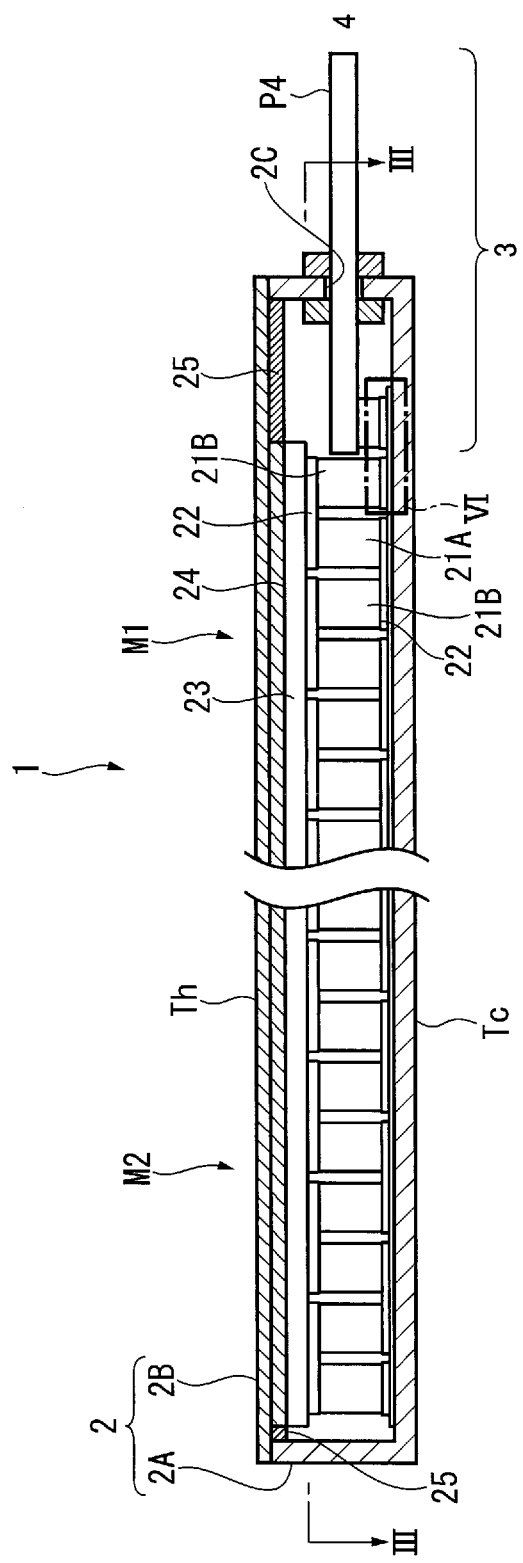
FIG. 2 is a sectional side view of the thermoelectric generator unit seen in a direction indicated by arrows II-II in FIG. 1.
Figure 3:
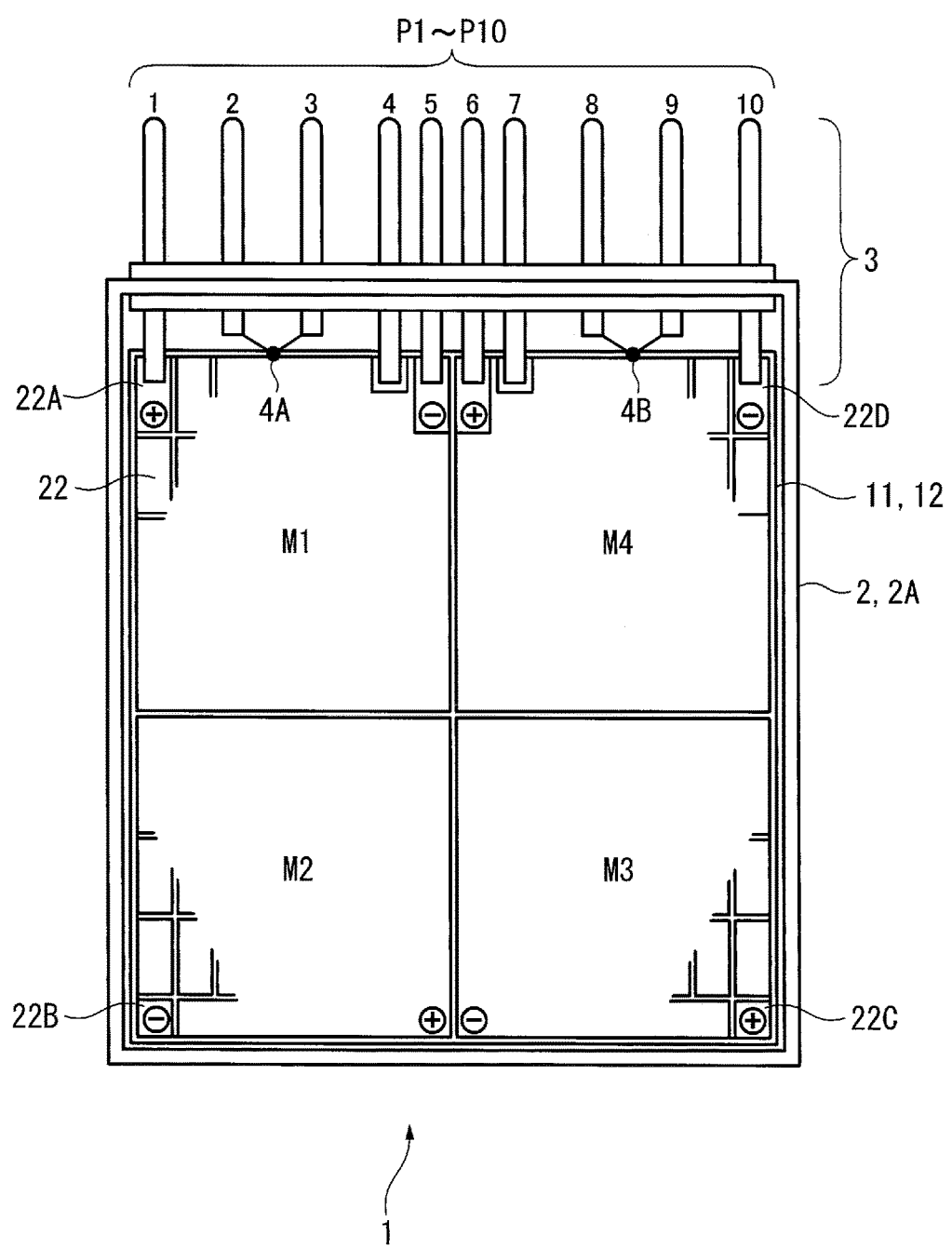
FIG. 3 is a sectional plan view of the thermoelectric generator unit seen in a direction indicated by arrows in FIG. 2.

FIG. 1 is a perspective view of a thermoelectric generator unit 1 according to the exemplary embodiment of the invention. FIG. 2 is a sectional side view of the thermoelectric generator unit 1 seen in a direction indicated by arrows II-II in FIG. 1. FIG. 3 is a sectional plan view of the thermoelectric generator unit 1 seen in a direction indicated by arrows in FIG. 2.

Arrangement of Thermoelectric Generator Unit

The thermoelectric generator unit 1, which has a front heating surface Th and a back cooling surface Tc as shown in FIGS. 1 and 2, includes a rectangular metal case 2 and first to fourth thermoelectric generator modules M1 to M4 that are housed in the case 2 and arranged in two columns and two rows as shown in FIG. 3. It should be noted that the shape of the case 2 and the layout of the first to fourth thermoelectric generator modules M1 to M4 are merely exemplary, and the invention is not limited thereto. The case 2 includes a box-shaped plated case body 2A with an open upper surface, and a plated case cover 2B having the same shape in a plan view as the case body 2A. The case body 2A and the case cover 2B are, for instance, flash-plated with nickel and then flash-plated with gold, or may be merely plated with nickel.

As shown in FIG. 2, an upper surface of the case cover 2B serves as the heating surface Th, and a lower surface of the case body 2A serves as the cooling surface Tc. The case cover 2B is girth-welded to the case body 2A all over the periphery thereof using a welding technique that enables merely a plating layer to be molten with almost none of a base material being molten. The upper surface of the case body 2A is reliably hermetically closed by the case cover 2B. It should be noted that the above welding technique enabling merely the plating layer to be molten is merely exemplary. A welding technique that causes the base material to partly melt may also be used. Alternatively, the case cover 2B may be attached with a bonding material instead of being welded.

The case body 2A has a side surface attached with a hermetic connector 3 that includes 10 lead pins P1 to P10 that are arranged side by side and extend inward and outward with respect to the case 2. The hermetic connector 3 holds the side surface of the case body 2A at front and back sides thereof. The lead pins P1 to P10 are respectively inserted through 10 through holes 2C provided to the side surface of the case body 2A.

An inert gas (e.g., argon gas, nitrogen gas, mixed gas of helium and nitrogen, and mixed gas of helium and argon) is enclosed in the case 2 hermetically closed by attaching the case cover 2B and the hermetic connector 3 thereto. It should be noted that the inner space of the case 2 may be in a vacuum state.

The first to fourth thermoelectric generator modules M1 to M4 each include a multilayer substrate 10 including laminated first to fifth layers. The first layer includes a plurality of interelement electrodes 22 configured to establish an electrical connection for a thermoelectric element 21. The second layer includes an insulating layer, i.e., a first substrate 11, and through holes H1 to H8 (described later). The third layer includes an electrically conductive layer, i.e., bypass patterns 13 to 15. The fourth layer includes an insulating layer, i.e., a second substrate 12, which forms the entire surface thereof. The fifth layer includes an electrically conductive layer, i.e., a copper plate 16, which forms the entire surface thereof. The first to fourth thermoelectric generator modules M1 to M4 shares the single multilayer substrate 10.

It should be noted that the first to fourth thermoelectric generator modules M1 to M4 may include a module (a full skeleton module) consisting of a multilayer substrate not including the interelement electrodes 22 of the first layer, the thermoelectric element 21, and an interelement electrode (plate).

The thermoelectric element 21, which is arranged on a surface of the first layer, includes a P-type thermoelectric element 21A and an N-type thermoelectric element 21B. The P-type thermoelectric element 21A and the N-type thermoelectric element 21B are each made of, for instance, a bismuth-tellurium (Bi—Te) material, a silicide material or the like, and shaped in the same-sized (or a different-sized) rectangular parallelepiped having a square cross section (or in a cylinder). The P-type thermoelectric element 21A and the N-type thermoelectric element 21B are alternately arranged side by side in a longitudinal direction in FIG. 3 and such an alternate arrangement is partly turned in a lateral direction in FIG. 3 so that the P-type thermoelectric element 21A and the N-type thermoelectric element 21B are longitudinally and laterally aligned.

An electric current runs through the P-type thermoelectric element 21A from a high-temperature side to a low-temperature side (in a downward direction in FIG. 2) due to the Seebeck effect, and through the N-type thermoelectric element 21B from a low-temperature side to a high-temperature side (in an upward direction in FIG. 2). Such an electric current caused in the thermoelectric element 21 is outputted through any pair of the lead pins P1 to P10. The first to fourth thermoelectric generator modules M1 to M4 thus generates an electric power.

The first to fourth thermoelectric generator modules M1 to M4 each include a π-type structure. As shown in FIG. 2, the adjacent P-type thermoelectric element 21A and N-type thermoelectric element 21B are alternately connected to corresponding one of the interelement electrodes 22 at upper and lower ends thereof. Such a connection of the P-type thermoelectric element 21A, the interelement electrode 22 and the N-type thermoelectric element 21B is repeated in this order, thereby electrically connecting all the elements of the thermoelectric element 21 in series in each of the thermoelectric generator modules M1 to M4. Such a series circuit functions as a thermoelectric generator circuit.

The first and fourth thermoelectric generator modules M1 and M4, which are relatively close to the lead pins P1 to P10, each have ends of an electric arrangement or circuit at upper-left corner and upper-right corner thereof in FIG. 3.

Specifically, the first thermoelectric generator module M1 includes a positive electrode defined by an interelement electrode 22A disposed at the upper-left corner thereof and a negative electrode defined by an interelement electrode (not shown) disposed at the upper-right corner thereof. The positive electrode or interelement electrode 22A is connected to the lead pin P1, and the negative electrode or the interelement electrode at the upper-right corner is connected to the lead pin P5.

The fourth thermoelectric generator module M4 includes a positive electrode defined by an interelement electrode (not shown) disposed at the upper-left corner thereof and a negative electrode defined by an interelement electrode 22D at the upper-right corner. The positive electrode or interelement electrode at the upper-left corner is connected to the lead pin P6, and the negative electrode or interelement electrode 22D at the upper-right corner is connected to the lead pin P10.

Similarly, the second and third thermoelectric generator modules M2 and M3, which are relatively remote from the lead pins P1 to P10, each include ends of an electric arrangement or circuit at lower-left corner and lower-right corner thereof in FIG. 2.

Specifically, the second thermoelectric generator module M2 includes a negative electrode defined by an interelement electrode 22B disposed at the lower-left corner thereof and a positive electrode defined by an interelement electrode (not shown) disposed at the lower-right corner thereof.

Figure 8:
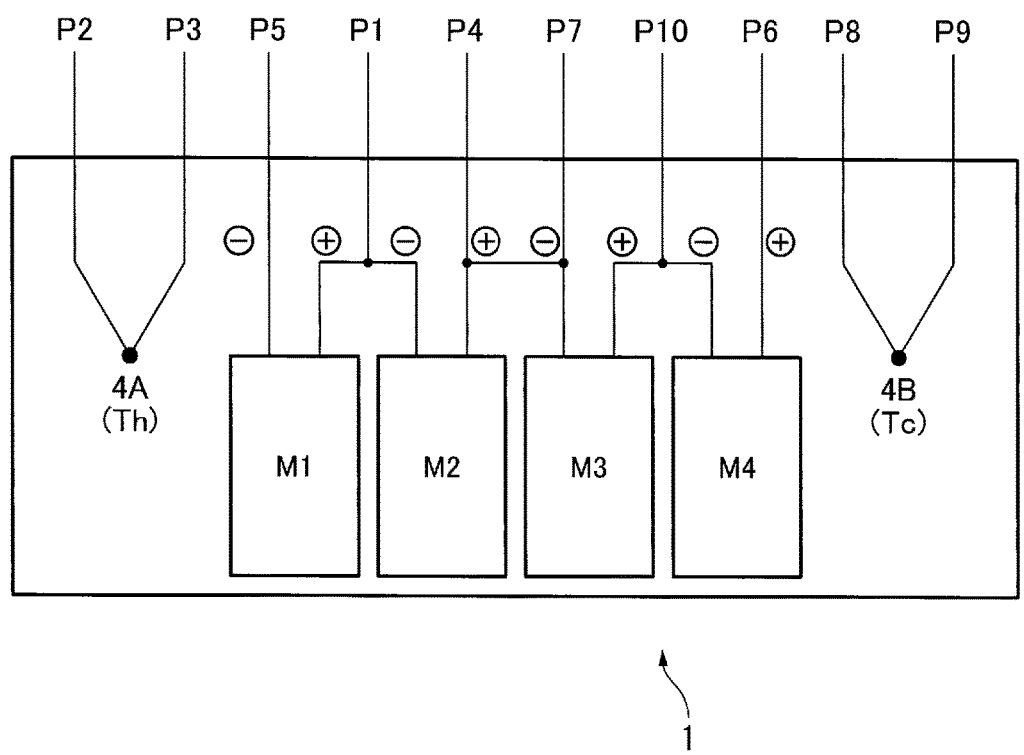
FIG. 8 is an equivalent circuit diagram of the thermoelectric generator unit.

The third thermoelectric generator module M3 includes a negative electrode defined by an interelement electrode disposed at the lower-left corner thereof and a positive electrode defined by an interelement electrode 22C at the lower-right corner The lead pins P2, P3, P8 and P9 are connected to thermocouples 4A and 4B (see FIGS. 3 and 8). The thermocouple 4A, which is connected to the lead pins P2 and P3, is disposed on a back surface of the case cover 2B to measure a temperature of the case cover 2B (i.e., a temperature of the heating surface Th). The thermocouple 4B, which is connected to the lead pins P8 and P9, is disposed on the first substrate 11 to measure a temperature of the first substrate 11 (i.e., a temperature of the cooling surface Tc).

A thermally conductive insulating plate 23 with a high thermal conductivity is provided on ones of the interelement electrodes 22 near the heating surface Th. An upper surface of the insulating plate 23 is entirely in contact with the back surface of the case cover 2B via a thermally conductive sheet 24. A peripheral portion of the back surface of the case cover 2B not covered by the insulating plate 23 is covered by an insulation shield 25.

The above arrangement allows heat transferred from a heat source to the heating surface Th to be well transferred to the first to fourth thermoelectric generator modules M1 to M4 through the case cover 2B, the thermally conductive sheet 24 and the insulating plate 23.

The insulation shield 25 serves to suppress a radiant heat at an area between peripheries of the first to fourth thermoelectric generator modules M1 to M4 and the case body 2A.

The suppression of the radiant heat leads to preventing: detachment of the lead pins P1 to P10 from a bonding member 6; deterioration of the sealability of the hermetic connector 3; and heating the lead pins P1 to P10 to a high temperature to make the diagnosis of the thermoelectric generator unit 1 (described later) difficult. The atmosphere in the case 2 (inert gas or vacuum) also serves to suppress oxidation and deterioration due to the radiant heat.

Figure 4:
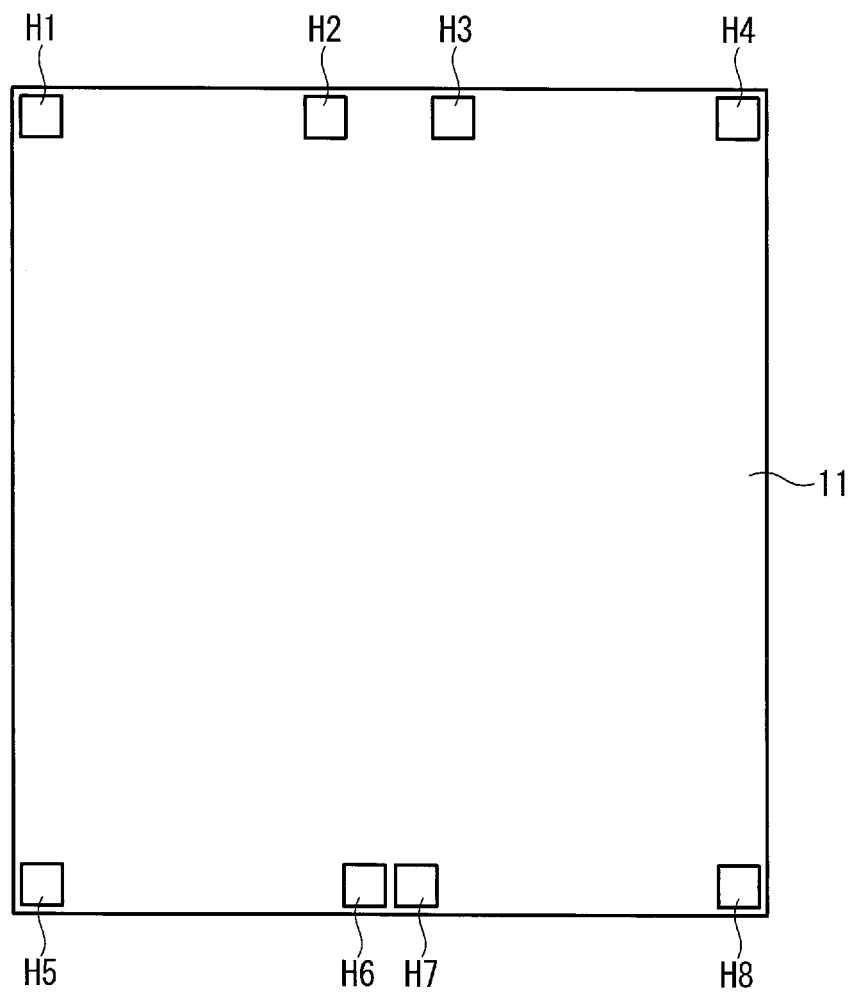
FIG. 4 is a plan view of a second layer.

FIG. 4 is a plan view of the first substrate 11 (the second layer). The directions of the first substrate 11 in FIG. 4 correspond to those of the thermoelectric generator unit 1 in FIG. 3. The first substrate 11, which is in a rectangular and symmetric shape in a plan view, has upper and lower peripheries that are respectively provided with the through holes H1 to H4 and H5 to H8 laterally arranged side by side and penetrating through the first substrate 11 from the front to back thereof. An inner space of each of the through holes H1 to H8 is filled with an electric conductor.

Figure 5:
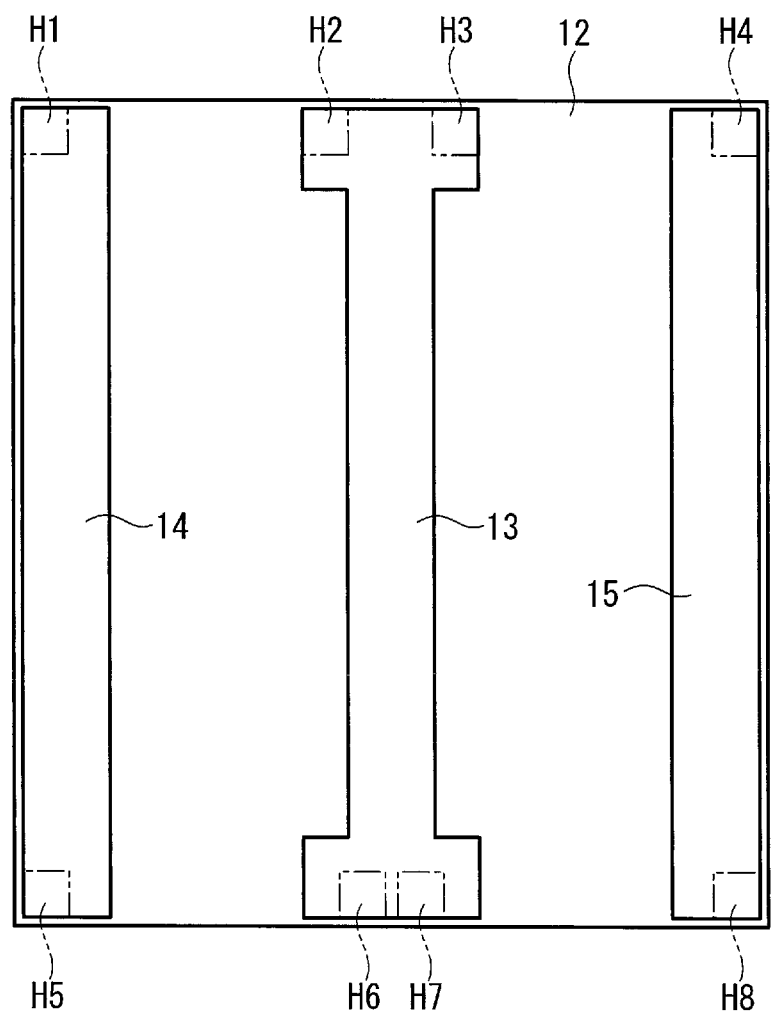
FIG. 5 is a plan view of third and fourth layers.

FIG. 5 is a plan view of the second substrate 12 layered on a back surface of the first substrate 11. It should be noted that the respective positions of the through holes H1 to H8 of the first substrate 11 are shown by chain double-dashed lines in FIG. 5 for reference. A front surface of the second substrate 12 is provided with a center bypass pattern 13 including a conductor in the form of a thin film and right and left bypass patterns 15, 14 at the right and left of the center bypass pattern 13. The bypass patterns 13 to 15 function as the third layer of the multilayer substrate 10, and the second substrate 12 functions as the fourth layer of the multilayer substrate 10 as described above. The center bypass pattern 13, which is in an I-shape in a plan view extending in a longitudinal direction in FIG. 5, has upper and lower ends on which the through holes H2 and H3 and the through holes H6 and H7 are respectively laid. The lead pins P4 and P7 are respectively connected to the upper end of the center bypass pattern 13 through the through hole H2 and H3.

The left bypass pattern 14 and the right bypass pattern 15 are each in a belt-shape extending in parallel with the center bypass pattern 13. The left bypass pattern 14 has upper and lower ends on which the through hole H1 and the through hole H5 are respectively laid. The right bypass pattern 15 has upper and lower ends on which the through hole H4 and the through hole H8 are respectively laid.

Figure 6:
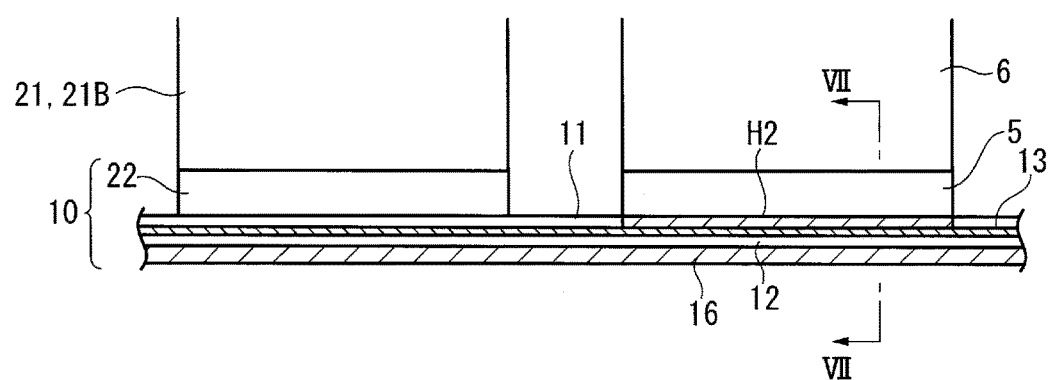
FIG. 6 is a partial enlarged view of a part indicated by a reference character VI in FIG. 2.
Figure 7:
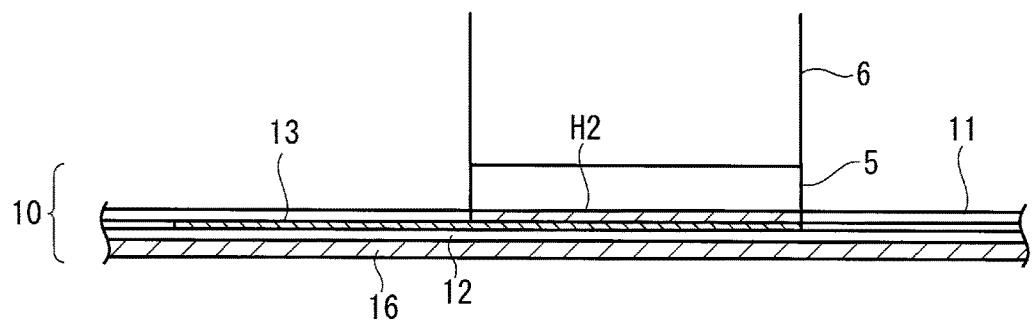
FIG. 7 is a sectional side view of the thermoelectric generator unit seen in a direction indicated by arrows VII-VII in FIG. 6.

Description will be made on an arrangement in the vicinity of the through hole H2 with reference to FIGS. 6 and 7. FIG. 6 is an enlarged view of a part indicated by a reference character VI surrounded by a chain line in FIG. 2. FIG. 7 is a sectional side view seen in a direction indicated by arrows VII-VII in FIG. 6.

A through-hole electrode 5 is provided at an upper side of the through hole H2 to be in contact therewith. The through-hole electrode 5 is electrically continuous with the lead pin P7 through the bypass pattern 13 of the third layer and the through hole H3. The through hole H2 is thus electrically continuous with the lead pin P7. The through-hole electrode 5 may be bonded to the bonding member 6 and the bonding member 6 may be bonded to the lead pin P4 by a mechanical bonding that is unaffected by heat (e.g., crimping) or a welding technique that is less affected by heat (e.g., spot welding). A lower side of the through hole H2 is in contact with the center bypass pattern 13 of the second substrate 12, and the copper plate 16 is provided between a lower side of the second substrate 12 and the cooling surface Tc. The copper plate 16 serves as the fifth layer of the multilayer substrate 10 as described above.

The above arrangement is substantially the same as one in the vicinity of the through hole H3. The through hole H3 is, however, electrically continuous with the through-hole electrode 5 and the lead pin P7.

The through hole H2 is also electrically continuous with the through hole H3 through the center bypass pattern 13. The lead pin P4 is thus electrically continuous with the lead pin P7.

The positive interelement electrode 22A of the first thermoelectric generator module M1 is provided at an upper side of the through hole H1 to be in contact therewith. The interelement electrode 22A is bonded to the lead pin P1. The through hole H1 is thus electrically continuous with the lead pin P1.

The above arrangement is the same as one in the vicinity of the through hole H4. The through hole H4 is, however, electrically continuous with the negative interelement electrode of the fourth thermoelectric generator module M4 and the lead pin P10.

The negative interelement electrode of the first thermoelectric generator module M1 is bonded to the lead pin P5.

The positive interelement electrode of the fourth thermoelectric generator module M4 is bonded to the lead pin P6. The positive interelement electrode of the second thermoelectric generator module M2 is electrically continuous with the through hole H6 and the lead pins P4 and P7.

The negative interelement electrode 22B of the second thermoelectric generator module M2 is provided at an upper side of the through hole H5 to be in contact therewith. The through hole H8 is electrically continuous with the through hole H1 and the lead pin P1 through the left bypass pattern 14.

The positive interelement electrode 22C of the third thermoelectric generator module M3 is provided at an upper side of the through hole H8 to be in contact therewith. The through hole H8 is electrically continuous with the through hole H4 and the lead pin P10 through the right bypass pattern 15.

The positive interelement electrode 22 of the second thermoelectric generator module M2 is provided at an upper side of the through hole H6 to be in contact therewith. The negative interelement electrode 22 of the third thermoelectric generator module M3 is provided at an upper side of the through hole H7 to be in contact therewith. The through hole H6 and the through hole H7 are electrically continuous with the through holes H2 and H3 and the lead pins P4 and P7 through the center bypass pattern 13.

Diagnosis of Thermoelectric Generator Module

The thermoelectric generator unit 1 having the above arrangement is configured to detect an output from each of the first to fourth thermoelectric generator modules M1 to M4 and detect an output from a combination of two or more of the first to fourth thermoelectric generator modules M1 to M4.

The output from each of the thermoelectric generator modules M1 to M4 and the output from a combination of two or more thereof are detectable through ones of the lead pins P1 to P10 and current paths as follows.

(1) M1, P1 to P5 the lead pin P1→the positive electrode of the first thermoelectric generator module M1→the negative electrode of the first thermoelectric generator module M1→the lead pin P5

(2) M2, P4 to P1 the lead pin P4→the through hole H2→the center bypass pattern 13→the through hole H6→the positive electrode of the second thermoelectric generator module M2→the negative electrode of the second thermoelectric generator module M2→the through hole H5→the left bypass pattern 14→the through hole H1→the lead pin P1

(3) M3, P10 to P7 the lead pin P10→the through hole H4→the right bypass pattern 15→the through hole H8→the positive electrode of the third thermoelectric generator module M3→the negative electrode of the third thermoelectric generator module M3→the through hole H7→the center bypass pattern 13→the through hole H3→the lead pin P7

(4) M4, P6 to P10 the lead pin P6→the positive electrode of the fourth thermoelectric generator module M4→the negative electrode of the fourth thermoelectric generator module M4→the lead pin P10

(5) M1 +M2, P4 to P5 the lead pin P4→the through hole H2→the center bypass pattern 13→the through hole H6→the positive electrode of the second thermoelectric generator module M2→the negative electrode of the second thermoelectric generator module M2→the through hole H5→the left bypass pattern 14→the through hole H1→the positive electrode of the first thermoelectric generator module M1→the negative electrode of the first thermoelectric generator module M1→the lead pin P5

(6) M1+M2+M3, P10 to P5 the lead pin P10→the through hole H4→the right bypass pattern 15→the through hole H8→the positive electrode of the third thermoelectric generator module M3→the negative electrode of the third thermoelectric generator module M3→the through hole H7→the center bypass pattern 13→the through hole H6→the positive electrode of the second thermoelectric generator module M2→the negative electrode of the second thermoelectric generator module M2→the through hole H5→the left bypass pattern 14→the through hole H1→the positive electrode of the first thermoelectric generator module M1→the negative electrode of the thermoelectric generator module M1→the lead pin P5

(7) M2+M3+M4, P6 to P1 the lead pin P6→the positive electrode of the fourth thermoelectric generator module M4→the negative electrode of the fourth thermoelectric generator module M4→the through hole H4→the right bypass pattern 15→the through hole H8→the positive electrode of the third thermoelectric generator module M3→the negative electrode of the third thermoelectric generator module M3→the through hole H7→the center bypass pattern 13→the through hole H6→the positive electrode of the second thermoelectric generator module M2→the negative electrode of the second thermoelectric generator module M2→the through hole H5→the left bypass pattern 14→the through hole H1→the lead pin P1

(8) M1+M2+M3+M4, P6 to P5 the lead pin P6→the positive electrode of the fourth thermoelectric generator module M4→the negative electrode of the fourth thermoelectric generator module M4→the through hole H4→the right bypass pattern 15→the through hole H8→the positive electrode of the third thermoelectric generator module M3→the negative electrode of the third thermoelectric generator module M3→the through hole H7→the center bypass pattern 13→the through hole H6→the positive electrode of the second thermoelectric generator module M2→the negative electrode of the second thermoelectric generator module M2→the through hole H5→the left bypass pattern 14→the through hole H1→the positive electrode of the first thermoelectric generator module M1→the negative electrode of the first thermoelectric generator module M1→the lead pin P5

(9) M2+M3, P10 to P1 the lead pin P10→the through hole H4→the right bypass pattern 15→the through hole H8→the positive electrode of the third thermoelectric generator module M3→the negative electrode of the third thermoelectric generator module M3→the through hole H7→the center bypass pattern 13→the through hole H6→the positive electrode of the second thermoelectric generator module M2→the negative electrode of the second thermoelectric generator module M2→the through hole H5→the left bypass pattern 14→the through hole H1→the lead pin P1

(10) M3 +M4, P6 to P7 the lead pin P6→the positive electrode of the fourth thermoelectric generator module M4→the negative electrode of the fourth thermoelectric generator module M4→the through hole H4→the right bypass pattern 15→the through hole H8→the positive electrode of the third thermoelectric generator module M3→the negative electrode of the third thermoelectric generator module M3→the through hole H7→the center bypass pattern 13→the through hole H3→the lead pin P7

Diagnostic Process of Thermoelectric Generator Module

Figure 9:
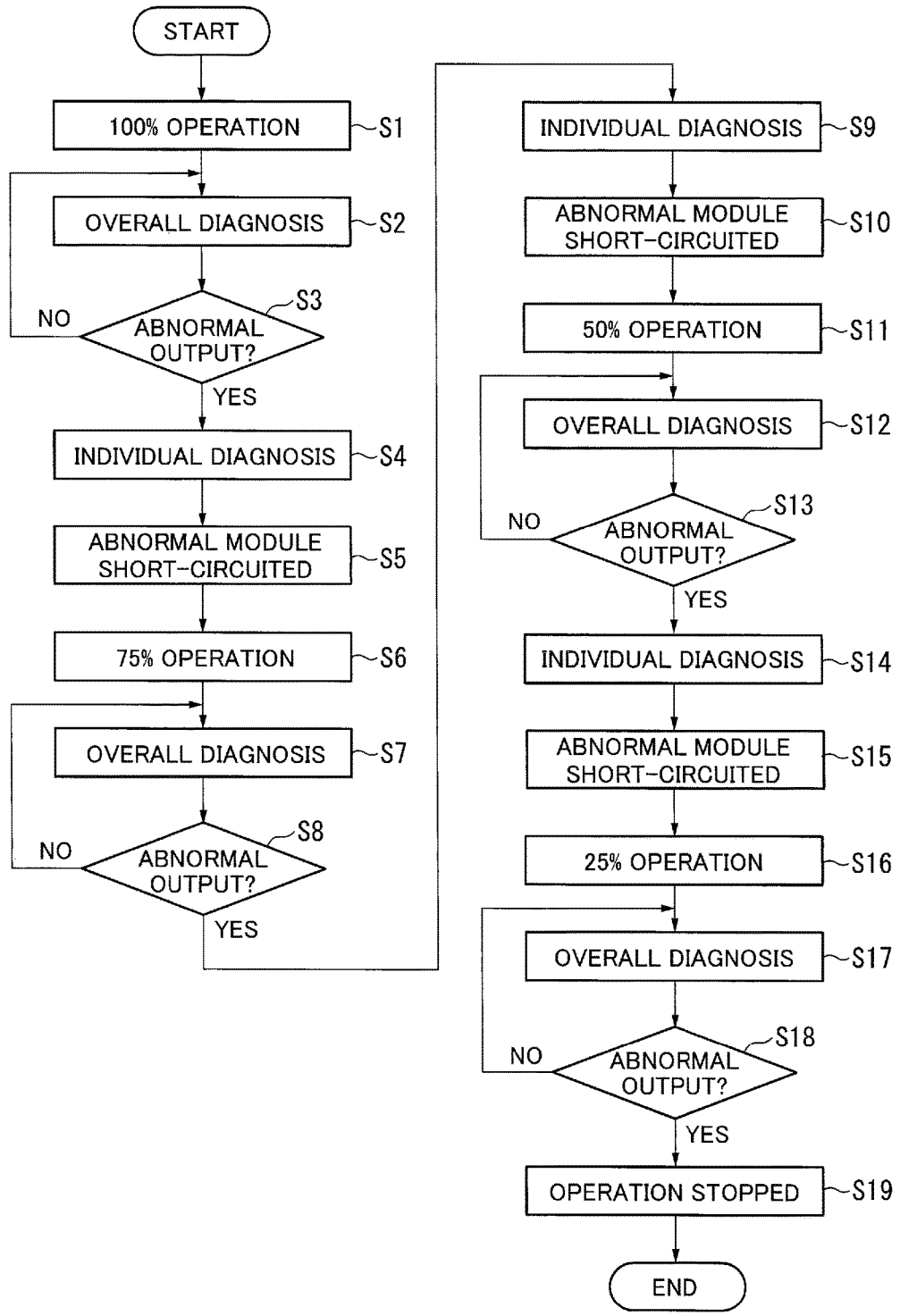
FIG. 9 is a flowchart of a thermoelectric generator unit diagnostic process.

Next, description will be made on a diagnostic process of the first to fourth thermoelectric generator modules M1 to M4 with reference to FIG. 9. The process is designed to detect any one(s) of the first to fourth thermoelectric generator modules M1 to M4 that is disabled due to deterioration and/or malfunction so that an electric power is generated by the rest of the thermoelectric generator modules M1 to M4 in a normal operation.

At the start of the process, a "100% operation" of the first to fourth thermoelectric generator modules M1 to M4 is started to generate an electric power through the lead pins P6 and P5 in Step S1. An "overall diagnosis" is then performed to measure an output from the thermoelectric generator unit 1 in Step S2. The "overall diagnosis" is repeated at predetermined intervals.

Subsequently, it is determined whether or not an "abnormal output" occurs based on a determination result of whether or not the measured output exceeds a preset 100%-operation threshold in Step S3. The 100%-operation threshold to be compared with the output is a lower limit of an electric power to be generated by the thermoelectric generator unit 1 when none of the thermoelectric generator modules M1 to M4 deteriorates and/or malfunctions.

When the output by the 100%-operation exceeds the 100%-operation threshold, the "abnormal output" is determined not to occur. The power generation by the first to fourth thermoelectric generator modules M1 to M4 is thus continued, and the "overall diagnosis" in Step S2 is again performed after the elapse of the predetermined intervals.

When the output by the 100%-operation is less than the 100%-operation threshold, it is determined that deterioration and/or malfunction of one of the first to fourth thermoelectric generator modules M1 to M4 should occur (i.e., the "abnormal output" is determined to occur). In this case, the process proceeds to Step S4, and an "individual diagnosis" is performed. The thermoelectric generator unit 1 is also configured to detect an output from each of the first to fourth thermoelectric generator modules M1 to M4 as described above. According to the "individual diagnosis", an output from each of the first thermoelectric generator modules M1 to M4 is detected in this order to find out which one of the first thermoelectric generator modules M1 to M4 is in an abnormal operation.

When the thermoelectric generator module in the abnormal operation is identified, ones of the lead pins P1 to P10 to be used are changed in Step S5 to short-circuit the thermoelectric generator module in the abnormal operation. For instance, when the first thermoelectric generator module M1 is in the abnormal operation, the lead pin P6 and the lead pin P1 are used so that the second to fourth thermoelectric generator modules M2 to M4 generate an electric power.

A "75% operation" of the second to fourth thermoelectric generator modules M2 to M4 is then started to generate an electric power in Step S6, and the "overall diagnosis" is performed in Step S7.

Subsequently, it is determined whether or not the "abnormal output" occurs based on a determination result of whether or not the measured output exceeds a preset 75%-operation threshold in Step S8.

When the output by the 75%-operation exceeds the 75%-operation threshold, the "abnormal output" is determined not to occur. The power generation by the second to fourth thermoelectric generator modules M2 to M4 is thus continued, and the "overall diagnosis" in Step S7 is again performed.

When the output by the 75%-operation is less than the 75%-operation threshold, it is determined that deterioration and/or malfunction of any one of the second to fourth thermoelectric generator modules M2 to M4 should occur (i.e., the "abnormal output" is determined to occur). In this case, the process proceeds to Step S9, and the "individual diagnosis" is performed to find out which one of the second to fourth thermoelectric generator modules M2 to M4 is in the abnormal operation. When the thermoelectric generator module in the abnormal operation is identified, ones of the lead pins P1 to P10 to be used are changed in Step S10 to short-circuit the thermoelectric generator module in the abnormal operation. For instance, when the second thermoelectric generator module M2 is in the abnormal operation at this time following the previous abnormal operation of the first thermoelectric generator module M1, the lead pin P6 and the lead pin P7 are used so that the third and fourth thermoelectric generator modules M3 and M4 generate an electric power.

A "50% operation" of the third and fourth thermoelectric generator modules M3 and M4 is then started to generate an electric power in step S11, and the "overall diagnosis" is performed in Step S12.

Subsequently, it is determined whether or not the "abnormal output" occurs based on a determination result of whether or not the measured output exceeds a preset 50%-operation threshold in Step S13.

When the output by the 50%-operation exceeds the 50%-operation threshold, the "abnormal output" is determined not to occur. The power generation by the third and fourth thermoelectric generator modules M3 and M4 is thus continued, and the "overall diagnosis" in Step S11 is again performed.

When the output by the 50%-operation is less than the 50%-operation threshold, it is determined that deterioration and/or malfunction of either one of the third and fourth thermoelectric generator modules M3 and M4 should occur (i.e., the "abnormal output" is determined to occur). In this case, the process proceeds to Step S14, and the "individual diagnosis" is performed to find out which one of the third and fourth thermoelectric generator modules M3 and M4 is in the abnormal operation. When the thermoelectric generator module in the abnormal operation is identified, ones of the lead pins P1 to P10 to be used are changed in Step S15 to short-circuit the thermoelectric generator module in the abnormal operation. For instance, when the third thermoelectric generator module M3 is in the abnormal operation following the previous abnormal operation of the first and second thermoelectric generator modules M1 and M2, the lead pin P6 and the lead pin P10 are used so that the fourth thermoelectric generator module M4 generates an electric power.

A "25% operation" of the remaining fourth thermoelectric generator module M4 is then started to generate an electric power in step S16, and the "overall diagnosis" is performed in Step S17.

Subsequently, it is determined whether or not the "abnormal output" occurs based on a determination result of whether or not the measured output exceeds a preset 25%-operation threshold in Step S18.

When the output by the 25%-operation exceeds the 25%-operation threshold, the "abnormal output" is determined not to occur. The power generation by the fourth thermoelectric generator module M4 is thus continued, and the "overall diagnosis" in Step S17 is again performed.

When the output by the 25%-operation is less than the 25%-operation threshold, it is determined that deterioration and/or malfunction of the remaining fourth thermoelectric generator module M4 should occur, and thus the operation of the thermoelectric generator unit 1 is stopped.

According to the above exemplary embodiment, the respective base ends of the lead pins P1 to P10, which penetrate through the case 2 inward and outward, are connected to both the ends of an output circuit including the first to fourth thermoelectric generator modules M1 to M4. The first to fourth thermoelectric generator modules M1 to M4 are thus individually diagnosed without the necessity of opening/closing the case 2.

One(s) of the first to fourth thermoelectric generator modules M1 to M4 to be diagnosed can be changed through the choice of the lead pins P1 to P10. As compared with an instance where a mechanism (e.g., terminal block) for changing an object to be diagnosed is provided in the case 2, the filing rate in the thermoelectric generator unit 1 can be increased, and a device, which includes the thermoelectric generator unit 1 with a high temperature, does not need to be stopped.

The first substrate 11, which includes the interelement electrodes 22, is provided with the through holes H1 to H8 that are electrically continuous with the bypass patterns 13 to 15 of the second substrate 12. The thermoelectric generator unit 1 can thus be reliably diagnosed through each of the bypass patterns 13 to 15.

Modification(s)

According to the exemplary embodiment, the first to fourth thermoelectric generator modules M1 to M4 are arranged in two columns and two rows in the case 2. The number and arrangement of the thermoelectric generator module(s) are, however, not limited to those of the exemplary embodiment. The thermoelectric generator modules may be increased on the basis of a unit of two columns and two rows. For instance, first to sixteenth thermoelectric generator modules may be arranged in four columns and four rows in the case 2. The increase in the number of the thermoelectric generator modules leads to an increase in the number of the laminated layers of the multilayer substrate 10, and thus to a change in the number and arrangement of through holes and bypass patterns.

Figure 10:
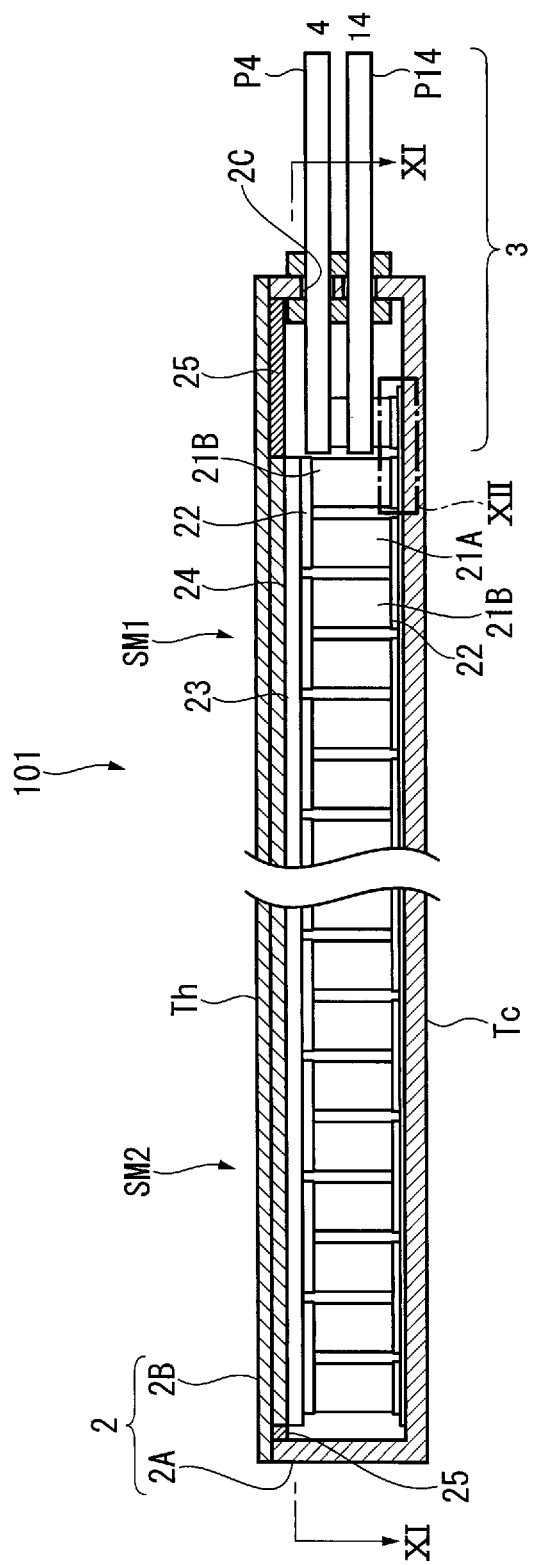
FIG. 10 is a sectional side view of a thermoelectric generator unit according to a modification.
Figure 11:
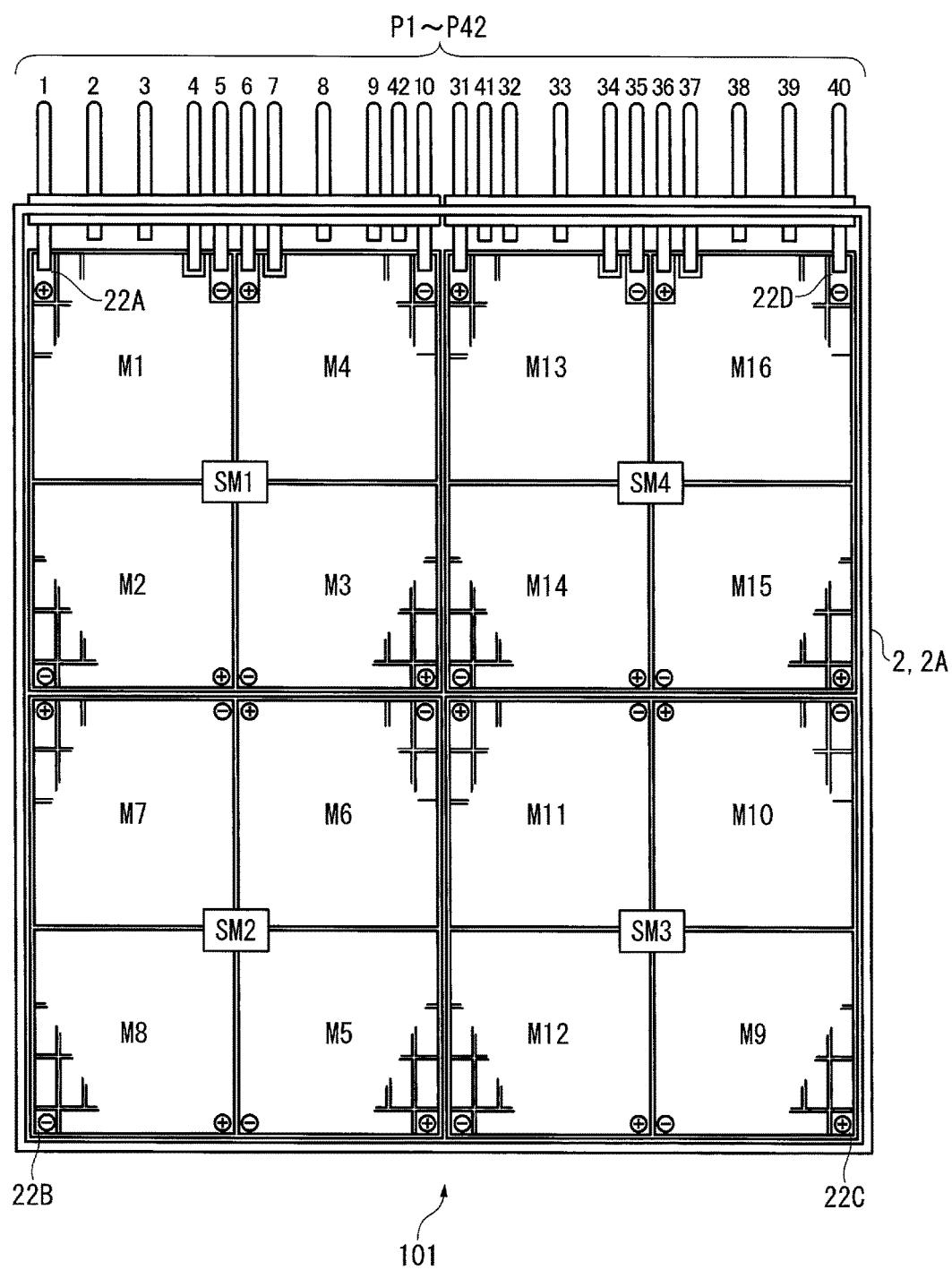
FIG. 11 is a sectional plan view of the thermoelectric generator unit according to the modification seen in a direction indicated by arrows XI-XI in FIG. 10.
Figure 12:
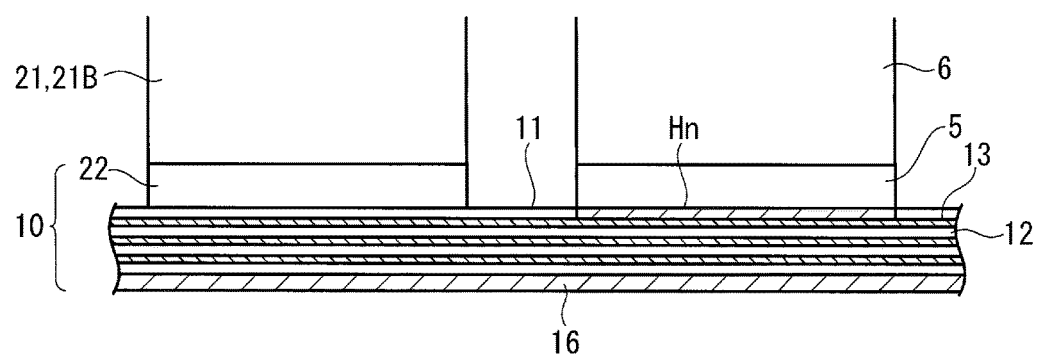
FIG. 12 is a partial enlarged view of a part indicated by a reference character XII in FIG. 10.

FIGS. 10 to 12 show a thermoelectric generator unit 101 according to a modification. FIG. 10 is a sectional side view of the thermoelectric generator unit 101. FIG. 11 is a sectional plan view of the thermoelectric generator unit 101 seen in a direction indicated by arrows XI-XI in FIG. 2. FIG. 12 is a partial enlarged view of a part indicated by a reference character XII in FIG. 10.

Component(s) identical to or corresponding to those of the thermoelectric generator unit 1 according to the exemplary embodiment are identified with the same reference numerals, and the description thereof will be omitted.

As shown in FIG. 11, the thermoelectric generator unit 101 includes a first thermoelectric generator module set SM1 and a second thermoelectric generator module set SM2 that are housed in the case 2, the first thermoelectric generator module set SM1 including the first to fourth thermoelectric generator modules M1 to M4 arranged in two columns and two rows, the second thermoelectric generator module set SM2 including fifth to eighth thermoelectric generator modules M5 to M8. The case body 2A has a side surface attached with the hermetic connector 3 that includes 42 lead pins P1 to P42 in total (22 pins in the upper tier and 20 pins in the lower tier) that extend inward and outward with respect to the case 2. Since the thermoelectric generator modules are increased in number as compared with those of the exemplary embodiment, the number of the lead pins is also increased (i.e., 10 pins to 42 pins). Further, the number of the laminated layers of the bypass patterns is also increased as shown in FIG. 12 (the third layer in the exemplary embodiment is multiplied by three (i.e., the third, fifth and seventh layers in the modification)). Consequently, the number of the laminated layers of the multilayer substrate 10 is increased to five to nine. The number and arrangement of the through holes (not shown) laid on the bypass patterns are also changed. It should be noted that a reference character "Hn" in FIG. 12 means the n-th through hole.

Similarly to the thermoelectric generator unit 1 according to the exemplary embodiment, the thermoelectric generator unit 101 is configured to detect an output from each of the first to fourth thermoelectric generator module sets SM1 to SM4 and to detect an output from a combination of two or more of the first to fourth thermoelectric generator module sets SM1 to SM4. Further, when any one(s) of the first to fourth thermoelectric generator module sets SM1 to SM4 is in the abnormal operation, the thermoelectric generator unit 101 is configured to detect an output from each of and an output from a combination of two or more of the thermoelectric generator modules of the thermoelectric generator module set(s).

The scope of the invention is not limited to the above exemplary embodiment, but includes modifications and improvements as long as an object of the invention can be achieved.

For instance, the first to fourth thermoelectric generator modules M1 to M4 and the first to sixteenth thermoelectric generator modules M1 to M16 are arranged in the case 2 in the same number of columns and rows (exemplary embodiment: 2×2, modification: 4×4) according to the exemplary embodiment and the modification. The numbers of the thermoelectric generator modules in column and row may, however, be different (e.g., 1×4 and 2×8).

Although the inner space of each of the through holes H1 to H8 is filled with an electric conductor according to the exemplary embodiment, the structure of the through holes may be different as long as electricity passes therethrough in a front-back direction. For instance, the through holes may each have a hollow structure with an inner circumferential surface therewith coated with an electric conductor.

Although all the elements of the thermoelectric element 21 are electrically connected in series in the thermoelectric generator circuit in each of the thermoelectric generator modules M1 to M4 according to the exemplary embodiment, the elements may be partly connected in parallel.

The invention claimed is:

1. A thermoelectric generator unit comprising:
    a case having a heating surface and a cooling surface;
    a plurality of thermoelectric generator modules housed in the case, the thermoelectric generator modules comprising a plurality of thermoelectric elements;
    a multilayer substrate comprising:
        a first layer comprising an interelement electrode for forming an output circuit configured to connect the thermoelectric elements;
        a second layer provided with a plurality of through holes penetrating therethrough from front to back; and
        a third layer comprising a plurality of bypass patterns electrically continuous with the through holes; and
    a plurality of lead pins that penetrate through the case inward and outward, the plurality of lead pins having base ends connected to both ends of the output circuit on a surface of the first layer, the output circuit being defined in each of the thermoelectric generator modules;
    wherein the thermoelectric generator unit is configured to detect an output from each of the thermoelectric generator modules and an output from a selective combination of two or more of the thermoelectric generator modules,
    wherein the output from each of the thermoelectric generator modules is detected through a first set of lead pins among the plurality of lead pins, and
    wherein the output from the selective combination of two or more of the thermoelectric generator modules is detected through a second set of lead pins among the plurality of lead pins that is different from the first set of lead pins.

2. The thermoelectric generator unit according to claim 1, wherein the multilayer substrate is provided between the cooling surface and the thermoelectric generator modules.

3. The thermoelectric generator unit according to claim 1, further comprising a heat insulating member provided in the case between the heating surface and the lead pins.

4. The thermoelectric generator unit according to claim 1, wherein the thermoelectric generator unit is configured to detect from each of the thermoelectric generator modules electric current generated by the Seebeck effect.

5. The thermoelectric generator unit according to claim 1, wherein the thermoelectric generator unit is configured to detect an output from a combination of all of the thermoelectric generator modules housed in the case.

6. The thermoelectric generator unit according to claim 1, wherein the thermoelectric generator unit is configured to detect a first output from a first selective combination of the thermoelectric generator modules and a second output from a second selective combination of the thermoelectric generator modules, the second selective combination including less thermoelectric generator modules than the first selective combination.

7. The thermoelectric generator unit according to claim 6, wherein the first output is detected through a different set of lead pins among the plurality of lead pins than the second output.

8. The thermoelectric generator unit according to claim 1, wherein each selective combination of two or more of the thermoelectric generator modules corresponds to a different set of lead pins among the plurality of lead pins.

9. The thermoelectric generator unit according to claim 1, further comprising a first thermocouple configured to measure a temperature of the heating surface, and a second thermocouple configured to measure a temperature of the cooling surface.

10. The thermoelectric generator unit according to claim 9, wherein the plurality of lead pins further include a third set of lead pins that are connected to the first and second thermocouples.

* * * * *